United States Patent [19]

Nagaraj

[11] Patent Number: 5,057,789
[45] Date of Patent: Oct. 15, 1991

[54] CLASS AB CMOS AMPLIFIER

[75] Inventor: Krishnaswamy Nagaraj, Piscataway, N.J.

[73] Assignee: AT&T Bell Laboratories, Murray Hill, N.J.

[21] Appl. No.: 560,513

[22] Filed: Jul. 31, 1990

[51] Int. Cl.$^5$ ............................ H03F 3/26; H03F 3/16
[52] U.S. Cl. ..................................... 330/264; 330/277
[58] Field of Search ............... 330/264, 267, 269, 273, 330/277, 296

[56] References Cited

U.S. PATENT DOCUMENTS

| 4,800,339 | 1/1989 | Tanimoto et al. | 330/253 |
| 4,829,266 | 5/1989 | Pernici et al. | 330/253 |
| 4,868,518 | 9/1989 | Blanken et al. | 330/264 |
| 4,912,425 | 3/1990 | Kobayashi et al. | 330/264 X |

OTHER PUBLICATIONS

"A Highly Linear CMOS Buffer Amplifier", by John A. Fisher and Rudolf Koch, IEEE Journal of Solid-State Circuits, vol. sc-22, No. 3, Jun. 1987.
"A High-Performance CMOS Power Amplifier", by John A. Fisher, IEEE Journal of Solid-State Circuits, vol. sc-20, No. 6, Dec. 1985.

Primary Examiner—Steven Mottola

[57] ABSTRACT

A class AB CMOS amplifier stage is disclosed having well-controlled low quiescent current and good phase stability. A first FET in a complementary push-pull output stage is driven directly by an input signal biased so that such FET conducts a small quiescent current. The second FET in the output stage is driven through a level shifting circuit. The quiescent current in the level-shifting circuit is controlled by a reference voltage. The FETs in the output stage, the level-shifting circuit and the reference-voltage generator are sized with respect to each other to determine the relative magnitudes of quiescent currents and the overall gain of the circuit. The operation of the circuit is essentially independent of process-induced variables and power-supply fluctuations. The FETs in the level-shifting stage can have relatively low impedances for good phase response property.

8 Claims, 3 Drawing Sheets

CLASS AB CMOS AMPLIFIER

BACKGROUND OF THE INVENTION

This invention relates to amplifiers, more particularly to CMOS class AB amplifiers having low quiescent current and improved phase response.

It is desirable to have amplifiers capable of sourcing and sinking relatively high output currents while still having well-controlled low quiescent currents in the output stage and associated driving stages to conserve power. Such amplifiers are particularly necessary in battery-operated apparatus, for example, portable telephones. Class AB amplifiers typically used in such applications, but circuits for driving the output stages in such amplifiers have tended to be complex and to have disadvantages, such as consuming too much current and posing problems in achieving good phase margins for high frequency designs. It is also desirable to have such amplifiers that will operate properly despite fluctuations in power supply or battery voltage and variations in component characteristics from chip to chip.

It class AB amplifiers it is necessary to drive two output devices connected in a push-pull circuit with the same input signal. In a CMOS circuit, such output devices are typically complementary field-effect transistors (FETS). The input signal is applied to both output devices with a different quiesent or bias voltage for each device, thus requiring a level shift. Examples of prior art class AB amplifiers are shown in U.S. Pat. No. 4,800,339 issued Jan. 24, 1989. One such example includes a reference voltage generator, a subtractor, a voltage-to-current converter and a current-to-voltage converter to perform such level shift.

It is an object of this invention to provide an improved class AB CMOS amplifier having low quiescent current, good phase response and high-frequency capability and insensitivity to variations in FET characteristics from chip to chip and to fluctuations in power supply or battery voltage.

SUMMARY OF THE INVENTION

The class AB CMOS amplifier of my invention includes a conventional push-pull stage having two complementary common-source outputs FETs in series. The input signal is connected directly to the gate of one of the output FETs and through a level-shifting stage to the gate of the second output FET. The level-shifting stage includes a first FET operating as a source-follower, a current-control FET and a load FET, all connected in series. The input signal is connected to the gate of the source-follower FET, a reference voltage is connected to the gate of the current-control FET and the voltage across the load FET is applied to the gate of the second output FET. The magnitude of the reference voltage determines the magnitude of the quiescent current in the level-shifting stage and thereby the quiescent current in the second output FET. The circuit configuration permits the impedance levels in the level-shifting stage to be relatively low, thereby avoiding phase margin problems while still maintaining low quiescent currents. The FETs in the circuit are sized in pairs, with size ratios chosen to establish the gain of the circuit and desired relationships among quiescent currents, regardless of power-supply fluctuations and variations in FET characteristics from chip to chip.

In an alternative embodiment, an additional FET is connected to cause the input signal to vary the reference voltage, essentially doubling the drive to the second output FET.

DETAILED DESCRIPTION

Figure 1:
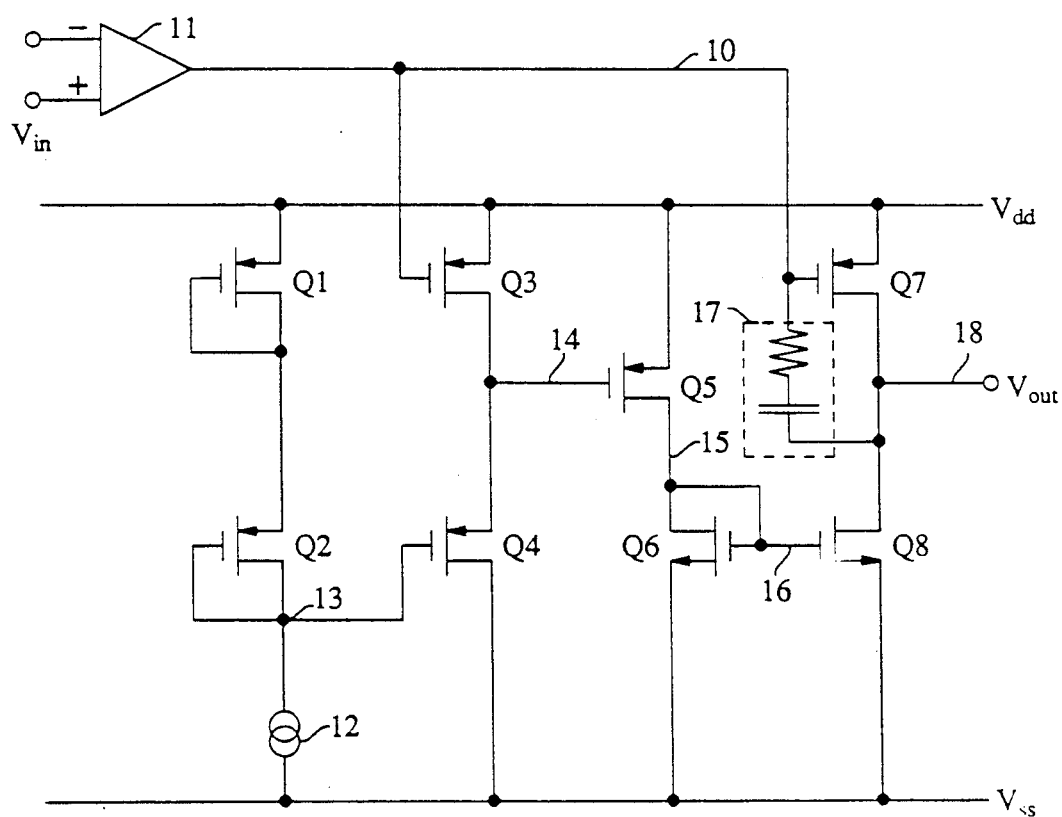
FIG. 1 is a circuit diagram of a prior-art class AB CMOS amplifier useful in pointing out the advantages of my invention.

The prior-art circuit of FIG. 1 is substantially that disclosed in U.S. Pat. No. 4,800,339 referred to above. Referring to FIG. 1, an input signal referenced to $V_{dd}$ is provided on lead 10 by input amplifier 11 and connected to the gates of field-effect transistors (FETs) Q3 and Q7. The output of amplifier 11 is biased so that when no signal is present, the quiescent voltage on lead 10 is more negative than $V_{dd}$ by somewhat more than the threshold voltage of an FET (about 1.25 volts), thus allowing a small quiescent current to flow in FET Q7.

Diode-connected FETs Q1 and Q2 and current source 12 form a voltage reference circuit that provides a constant-voltage output (with respect to $V_{dd}$) at node 13. Such constant-voltage output is substantially the sum of the threshold voltages of FETs Q1 and Q2 (about 2.5 volts). FET Q3 is a common-source amplifier with FET Q4 as a load. The current from source 12 and the sizes of the FETs are chosen so that the voltage gain of Q3 is $-1$ and the quiescent voltage at node 14 is the same as that on lead 10. The stage comprising FETs Q3 and Q4 is said to be a subtractor because the resulting signal at node 14 is the input signal subtracted from the reference voltage. FET Q5 converts voltage variations to node 14 into current variations in lead 15 and FET Q6 converts such current variations back into voltage variations at node 16. FETs Q5 and Q6 are sized to give a gain of $-1$, so the signal at node 16 is the same amplitude as and in phase with the signal on lead 10, but shifted so that the quiescent voltage at node 16 is more positive than $V_{ss}$ by about the threshold voltage of an FET, thus allowing the quiescent current flowing in FET Q8 to be substantially equal to that flowing in FET Q7. FETs Q7 and Q8 are connected as a conventional push-pull output stage. Series circuit 17 comprising a capacitor and a resistor is a phase compensation circuit for stabilizing operation of the amplifier when negative feedback is introduced between output terminal 18 and input amplifier 11. In accordance with class AB operation, as is well known, a positive-going signal on lead 10 will cause FET Q7 to be cut off and FET Q8 to conduct, whereas a negative-going signal on lead 10 will cause FET Q7 to conduct and FET Q8 to be cut off.

Figure 2:
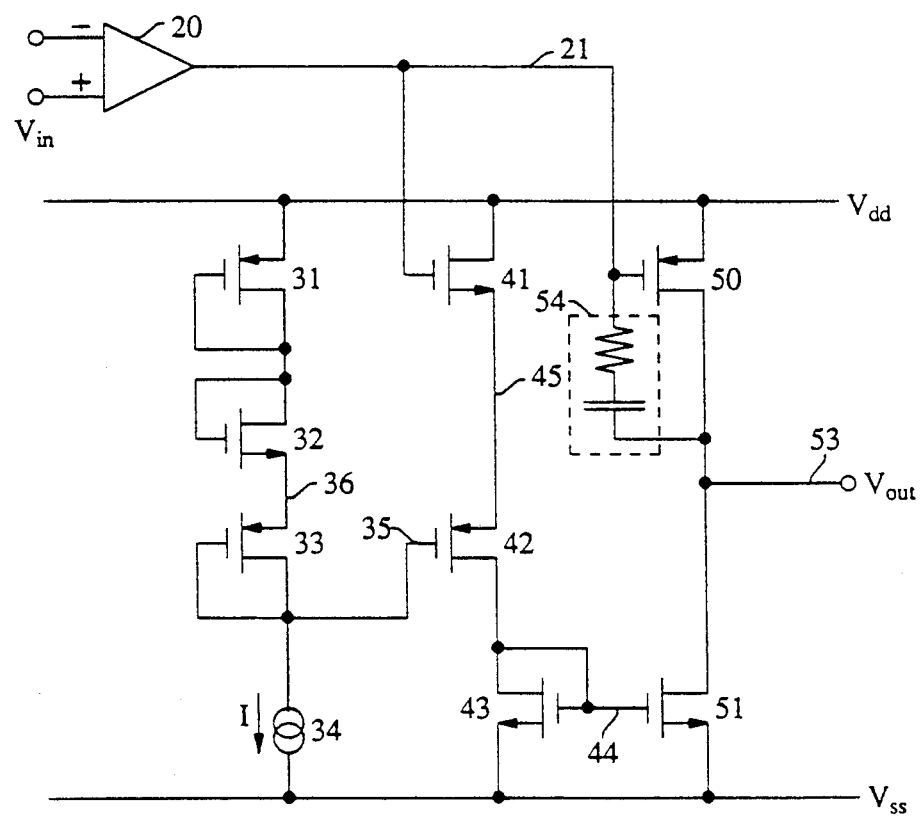
FIG. 2 is a circuit diagram of class AB amplifier constructed in accordance with my invention.

FIG. 2 is a circuit of a class AB CMOS amplifier configured in accordance with my invention. Referring now to FIG. 2, input amplifier 20 provides an input signal referenced to $V_{dd}$ on lead 21, which is connected directly to the gate of output FET 50. Input amplifier 20 can be a differential voltage amplifier or any other source capable of providing the necessary signal magnitude at the required bias level. Again, the output of amplifier 20 is biased so that the quiescent voltage on lead 21 is more negative than $V_{dd}$ by about the threshold voltage of an FET, thus allowing a small quiescent current to flow in FET 50.

Diode-connected FETs 31, 32 and 33 and current source 34 form a reference voltage generator that provides a constant voltage (with respect to $V_{dd}$) at node 35. By sizing the various FETs with respect to each other as will be described below, the magnitude of the reference voltage at node 35 becomes such that a small quiescent current, for example, about 25 microamperes, flows in the level-shifting stage comprising FETs 41, 42 and 43.

In the level-shifting stage, FET 41 is connected as a source-follower. FET 42 controls the quiescent current in the level-shifting stage in accordance with the magnitude of the reference voltage at node 35. The voltage across load FET 43 is connected to the gate of FET 51 at node 44. With no signal present, the voltage at node 44 will be more positive than $V_{ss}$ by about the threshold voltage of an FET, allowing the quiescent current flowing in FET 50 to also flow in FET 51. The signal at node 44 is in phase with the signal on lead 21 and FETs 41, 42 and 43 are sized so that the magnitudes of such signals are approximately equal.

FETs 50 and 51 are also connected as a conventional push-pull output stage. Series circuit 54 is a phase compensation circuit as described in conjunction with FIG. 1. Again in accordance with class AB operation, a positive-going signal on lead 21 will cause FET 50 to be cut off and FET 51 to conduct, whereas a negative-going signal on lead 21 will cause FET 50 to conduct and FET 51 to be cut off.

The various FETs in the circuit of FIG. 2 are sized by setting the dimensions of certain pairs of FETs of the same polarity type to be in accordance with certain ratios. For such sizing purposes, FET 31 is paired with FET 50, FET 33 with FET 42, FET 32 with FET 41 and FET 43 with FET 51. One possible set of ratios is for FET 32 to be equal in size to FET 41, FET 33 to be equal in size to FET 42, FET 50 to be N times larger than FET 31 and FET 51 to be N times larger than FET 43. Such ratios between FET 32 and FET 41 and between FET 33 and FET 42 cause the quiescent current in lead 45 to be essentially equal to the quiescent current I in lead 36, the magnitude of which is controlled by current source 34. The ratio N between FET 50 and FET 31 and between FET 51 and FET 43 causes the quiescent current through both FETs 50 and 51 to be substantially equal to N times I. A typical value for N is 10. As is well known in the art, circuit relationships established by size ratios as described above tend to be independent of variations in FET characteristics from one integrated circuit chip to another and from fluctuations in power-supply voltages.

Some of the properties of the class AB amplifier circuit configured as shown in FIG. 2 in accordance with my invention are also present in the prior art circuit of FIG. 1. However, the circuit of FIG. 2 has some clear advantages. First, the circuit of FIG. 2 contains only three branches instead of the four in the circuit of FIG. 1. Thus, the circuit of FIG. 2 can have significantly lower quiescent current. Another important, but less clearly evident, advantage relates to phase-related instabilities, as will now be described.

Design considerations, such as bias requirements and efficiency goals, typically result in the optimum magnitude of the signal at node 14 in the circuit of FIG. 1 and on lead 45 (and at node 44) in the circuit of FIG. 2 being approximately ±0.5 volt around the quiescent voltage.

In the circuit of FIG. 1, such a voltage swing would necessitate biasing FETs Q3 and Q4 at least 0.5 volts above their threshold voltages. If it is also desired to keep the quiescent current through FETs Q3 and Q4 low, say about 25 microamperes, then FETs Q3 and Q4 would need to be designed with low width-to-length ratios, resulting in relatively high-impedance devices. This results in high impedance at node 14 (determined primarily by the impedance of FET Q4), which becomes even higher during large positive swings of node 10 (negative swings of node 14) as the current through FETs Q3 and Q4 decreases and FET Q4 nears cutoff. Such high impedance can create a strong nondominant pole at a relatively low frequency, giving rise to poor phase margins and thus limiting the useful frequency range of such circuits.

In contrast, the circuit of FIG. 2 can be realized with relatively low-impedance FETs. FETs 41 and 42 can be biased at about 100 millivolts above their threshold voltages under quiescent conditions. For the same quiescent current of 25 microamperes, FETs 41 and 42 can have a relatively high width-to-length ratio, resulting in lower impedances and causing the non-dominant pole to occur at relatively higher frequencies. Furthermore, as the current through FETs 41 and 42 increases during large signal excursions, such impedances decrease, pushing the non-dominant pole to even higher frequencies. Thus, the circuit of FIG. 2 demonstrates superior phase response to that of the circuit of FIG. 1 and similar prior-art circuits.

In the circuit of FIG. 2, the quiescent voltage on lead 21 is typically about 1.25 volts more negative than $V_{dd}$. If amplifier 20 is powered from $V_{dd}$, the highest positive voltage excursion on lead 21 is typically about 0.75 volts more negative than $V_{dd}$ because of the limitations of circuits of the type that would typically be used for amplifier 20. This limits the voltage swing possible on the gate of FET 51 and thus the current-sinking capabilities of FET 51. This problem is alleviated by the improvement shown in the circuit of FIG. 3.

Figure 3:
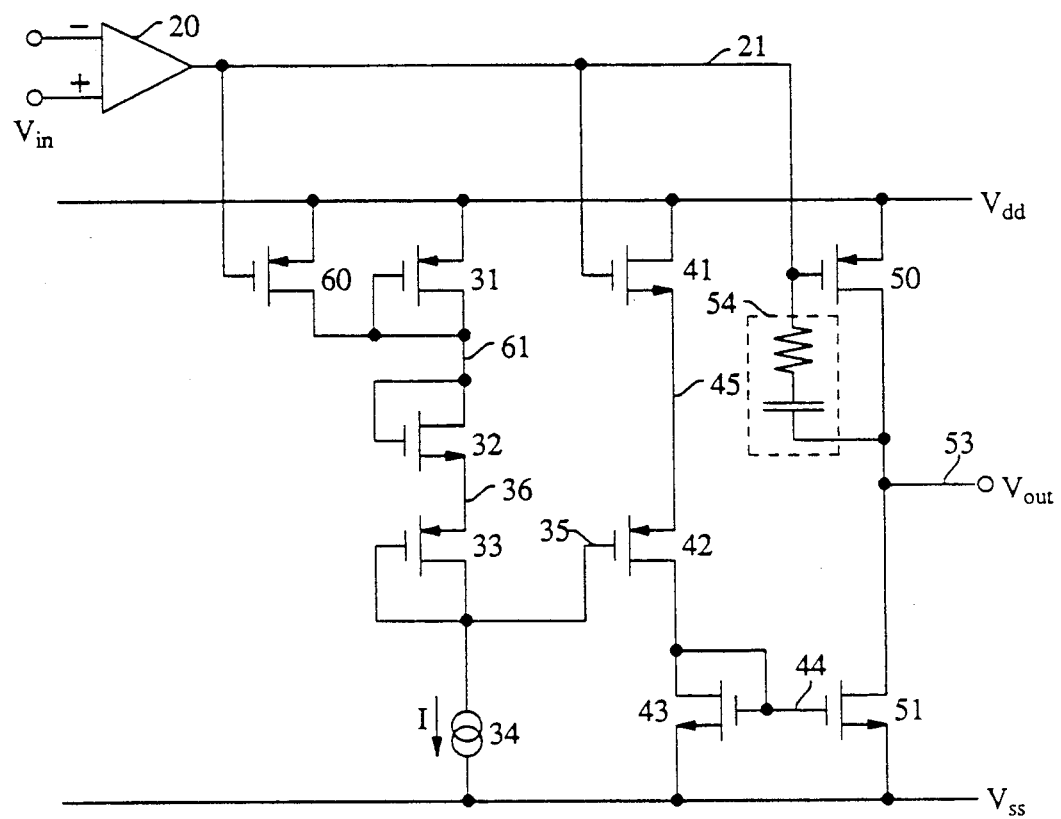
FIG. 3 is a circuit diagram of an alternative embodiment of the amplifier of FIG. 2.

The circuit of FIG. 3 is identical to that of FIG. 2 with the addition of additional FET 60, which has its source and drain connected in parallel with FET 31 and its gate connected to lead 21. In operation, as the input signal on lead 21 causes the voltage on lead 21 to become more positive, nodes 61 and 35 become more negative by about the same amount. The gate of FET 42 thus becomes more negative by about the same amount that the gate of FET 41 becomes positive, thereby increasing the voltage swing at node 44 and increasing the current-sinking ability of FET 51.

It would also be readily apparent to one skilled in the art how to modify the circuits of FIG. 2 and FIG. 3 for an input signal referenced to $V_{ss}$ instead of $V_{dd}$, for example, by inverting such circuits and reversing the FET polarity types.

It is understood that other embodiments are possible that incorporate the principles of my invention and that the above disclosure is merely illustrative of such principles and is not intended to be limiting in any respect.

I claim:

1. A class AB CMOS amplifier having an output stage comprising a first output FET connected between a first terminal of a power supply and an output terminal, a second output FET connected between said output terminal and a second terminal of said power supply, the input signal to said amplifier being connected to an input terminal and referenced to said first power-supply terminal, said input terminal being connected to the gate of said first output FET and to means for shifting said input-signal reference to said second power-supply terminal, the output of such shifting means being connected to the gate of said second output FET characterized in that said shifting means is a level-shifting stage comprising a source-follower FET, a current-control FET and a diode-connected load FET, said source-follower FET is connected between said first power-supply terminal and the source of said current-control FET, said load FET is connected between the drain of said current-control FET and said second power-supply terminal, said input terminal is connected to the gate of said source-follower FET, the gate of said current-control FET is connected to the output terminal of a reference voltage generator having its output voltage referenced to said first power-supply terminal and the drain of said current-control FET is connected to the gate of said second output FET, whereby the magnitude of said reference voltage controls the magnitude of the quiescent current in said level-shifting stage and in said output stage.

2. The amplifier of claim 1 wherein said reference-voltage generator comprises first, second and third diode-connected FETs all connected in series with a constant-current generator, one terminal of said first diode-connected FET is connected to said first power-supply terminal, one terminal of said constant-current generator is connected to said second power-supply terminal and the other terminal of said constant-current generator is the output terminal of said reference-voltage generator.

3. The amplifier of claim 2 wherein said first diode-connected FET is the same polarity type as said first output FET, said second diode-connected FET is the same polarity type as said source-follower FET, said third diode-connected FET is the same polarity type as said current-control FET and said load FET is the same polarity type as said second output FET.

4. The amplifier of claim 3 wherein said second diode-connected FET and said source-follower FET are equivalent in size, said third diode-connected FET and said current-control FET are equivalent in size, said first output FET is N times larger than said first diode-connected FET and said second output FET is N times larger than said load FET, whereby N is chosen to set the output quiescent current to a desired value.

5. The amplifier of claim 2 which further comprises means for varying the output of said reference voltage generator inversely with respect to said input signal, thereby increasing the maximum signal voltage across said load FET and the maximum signal current through said second output FET.

6. The amplifier of claim 5 in which said varying means comprises an additional FET of the same polarity type as said first diode-connected FET, the source and drain of said additional FET are connected, respectively, to the source and drain of said first diode-connected FET and the gate of said additional FET is connected to said input terminal.

7. A class AB CMOS amplifier having first and second complementary output FETs and a level-shifting stage wherein the input signal is connected to both the input of said level-shifting stage and the gate of said first output FET and the output of said level-shifting stage is connected to the gate of said second output FET characterized in that said level-shifting stage comprises a third FET connected as a follower, the gate of said third FET being the input of said level-shifting stage;

a fourth FET connected as a load, said third and fourth FETs being the same polarity type, a reference voltage generator; and a fifth FET of the opposite polarity type to said third and fourth FETs connected in series between said third and fourth FETs and having its gate connected to said reference voltage generator, the common point between said fourth FET and said fifth FET being the output of said level-shifting stage;

whereby the magnitude of the output from said reference voltage generator determines the magnitude of the quiescent current in said level-shifting stage and thereby the level of the quiescent current in said second output FET.

8. The amplifier of claim 7 which further comprises means for varying the output of said reference voltage generator inversely with respect to said input signal, thereby increasing the maximum signal voltage across said load FET and the maximum signal current through said second output FET.

* * * * *